United States Patent [19]

Banks et al.

[11] Patent Number: 4,978,604
[45] Date of Patent: Dec. 18, 1990

[54] PROCESS FOR FORMING IMAGES

[75] Inventors: Christopher P. Banks, Saffron Walden; Edward Irving, Burwell, both of England

[73] Assignee: Ciba-Geigy Corporation, Ardsley, N.Y.

[21] Appl. No.: 208,524

[22] Filed: Jun. 20, 1988

[30] Foreign Application Priority Data

Jul. 1, 1987 [GB] United Kingdom ................. 8715435

[51] Int. Cl.$^5$ .............................................. G03C 5/16
[52] U.S. Cl. .................................... 430/327; 430/328; 430/281; 430/286; 430/494
[58] Field of Search ............... 430/327, 328, 281, 286, 430/494; 522/4, 12, 21, 22, 15, 18, 26

[56] References Cited

U.S. PATENT DOCUMENTS

| | | | |
|---|---|---|---|
| 3,784,378 | 1/1974 | Gramas | 430/328 |
| 3,859,091 | 1/1975 | Wessells et al. | 430/327 |
| 3,926,643 | 12/1975 | Chang | 522/26 |
| 4,190,602 | 2/1980 | Brunisholz et al. | |
| 4,227,978 | 10/1980 | Barton | 430/286 |
| 4,291,118 | 9/1981 | Boduch et al. | 430/286 |
| 4,308,400 | 1/1981 | Felder et al. | |
| 4,318,791 | 12/1981 | Felder et al. | |
| 4,426,431 | 1/1984 | Harasta et al | 430/280 |
| 4,548,891 | 10/1985 | Riediker et al. | 430/283 |
| 4,559,371 | 12/1985 | Husler et al. | |
| 4,582,862 | 4/1986 | Berner et al. | |
| 4,590,287 | 5/1986 | Riediker et al. | |
| 4,595,651 | 6/1986 | Grossa | 430/280 |
| 4,710,523 | 12/1987 | Lechtken et al. | 522/26 |

FOREIGN PATENT DOCUMENTS 0108037 6/1986 European Pat. Off.
207893 6/1986 European Pat. Off.

Primary Examiner—Paul R. Michl
Assistant Examiner—Thorl Chea
Attorney, Agent, or Firm—Stephen V. O'Brien

[57] ABSTRACT

A process for the formation of an image comprises
(i) applying to a substrate a layer of a liquid composition which comprises
  (A) a polymerizable material having, on average, more than one polymerizable acrylic group per molecule,
  (B) a first radiation-activated polymerization initiator for (A) and
  (C) a second radiation-activated polymerization initiator for (A), the initiator (B) being activatable by radiation of longer wavelength than that of radiation by which (C) is activatable,
the composition being substantially free from polymerizable epoxide or vinyl ether groups when (B) or (C) is an aromatic onium salt,
(ii) subjecting the composition to radiation having a wavelength at which one of (B) and (C) is activated but the other is not substantially activated, thereby polymerizing (A) such that the layer of liquid composition is solidified but remains curable,
(iii) subjecting the solidified layer in a predetermined pattern to radiation having a wavelength at which the initiator not activated in stage (ii) is activated, such that in exposed areas the solidified layer is substantially cured, and
(iv) removing areas of the solidified layer that have not been cured.

The process is useful in the production of printing plates and printed circuits.

12 Claims, No Drawings

PROCESS FOR FORMING IMAGES

This invention relates to a process for forming images from liquid coatings on substrates by exposures to actinic radiation at different wavelengths.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the radiation become photopolymerised (and less soluble) while those parts shielded from the radiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation through an image, without evaporating organic solvents. Not only would, in this stage, the use be avoided of solvents which might present problems of toxicity and flammability and also cause expense in their recovery, but production on a continuous basis of coated supports, ready for imagewise irradiation, would be facilitated.

U.S. Pat. No. 4,291,118 describes a method for forming relief images from a film of a liquid photopolymerisable material, comprising solidifying the film by chemical hardening, usually by exposure to actinic radiation, then re-exposing the solidified film to actinic radiation in the form of a pattern so that parts of the film become chemically differentiated, and then selectively removing the portions of the film not exposed to the patterned exposure to actinic radiation by washing with a solvent.

There is no mention made of the possibility of using actinic radiation of two different wavelengths for the two exposures. In the Example given, both exposures are to radiation from the same stationary pulse xenon source. The only photopolymerisable materials mentioned are mixtures of polyenes with polythiols. This method is not easy to carry out successfully. When the initial solidification is carried out by irradiation, great care must be taken to give the right amount of irradiation since, if too little is given, the liquid composition will not solidify and if too much is given it will not be possible to obtain a good image after the second irradiation. Furthermore, the reaction between the polyene and the polythiol, which is initiated on exposure to actinic radiation, continues when such exposure is interrupted. For this reason the specification recommends commencing the second irradiation less than 30 minutes, and preferably less than 10 minutes, after the first irradiation, stating that, in many systems, a retention time between treatments of 30 minutes or longer would result in the inability to attain a proper differentiation in the chemical condition in the solidified mass. This time limitation is a further constraint on industrial utilisation of the process.

In European Patent Publication EP-A-0 207 893 there is described a process by means of which disadvantages of the process of U.S. Pat. No. 4,291,118 can be overcome. The process comprises (i) applying to a substrate a layer of a liquid composition comprising
   (A) a residue that is polymerizable by means of free radicals,
   (B) a radiation-activated polymerization initiator for (A),
   (C) a radiation-curable residue that is different from (A) and optionally
   (D) a radiation-activated catalyst for the cure of (C),
(ii) subjecting the composition to actinic radiation having a wavelength at which the initiator (B) is activated but at which the residue (C) or the catalyst (D) is not substantially activated, thereby polymerizing (A) such that the layer of liquid composition is solidified, but remains curable.
(iii) subjecting the solidified layer in a predetermined pattern to actinic radiation having a wavelength that is shorter than that of the radiation used in stage (ii) and at which the radiation-curable residue (C) or the catalyst (D) is activated, such that in the exposed areas (C) is substantially cured, and
(iv) removing areas of the solidified layer that have not been substantially cured.

The process of EP-A-0 207 893 therefore depends on the use of two different residues through which polymerization or curing takes place, one of these residues, (C), being activated, directly or indirectly, only by radiation of shorter wavelength than that used for polymerisation of the residue (A) by activation of the initiator (B). In this prior process the residue (A) polymerized in the first irradiation can be an acrylic residue but the residue (C) cured in the imagewise irradiation is a different curable residue such as an epoxy resin, a phenolic resin, a vinyl ether or a maleimido, chalcone or analogous residue. The necessity to use one of the residues (C) specified as suitable imposes a limitation on the achievable speed of the imagewise irradiation step. Furthermore, when the preferred residues (C) of the prior art process, i.e. epoxy resins, are used, difficulties arise in some image-forming processes. For instance, in processes requiring a cured resist to be stripped from a substrate, the presence of cured epoxy resin renders such stripping difficult.

It has now been found that by using a radiation-polymerizable acrylic material together with two different types of radiation-activated polymerization initiator, activatable at different wavelengths, it is not necessary to use different polymerizable residues for the solidification stage and the imagewise cure stage. Both solidification and imagewise cure can be effected through the acrylic residue, thereby facilitating the achievement of rapid imagewise cure speeds and of cured resists which can be readily removed from substrates by treatment with a solvent.

Accordingly, the present invention provides a process for the formation of an image which comprises (i) applying to a substate a layer of a liquid composition which comprises
   (A) a polymerizable material having, on average, more than one polymerizable acrylic group per molecule,
   (B) a first radiation-activated polymerization initiator for (A) and
   (C) a second radiation-activated polymerization initiator for (A), the initiator (B) being activatable by radiation of longer wavelength than that of radiation by which (C) is activatable, with the proviso that when (B) or (C) is an aromatic onium salt, the composition is substantially free from polymerizable epoxide or vinyl ether groups, (ii) subjecting the composition to radiation having a wavelength at which one of (B) and (C) is activated but the other is not substantially activated, thereby polymerizing (A) such that the layer of liquid composition is solidified but remains curable, (iii) subjecting the solidified layer in a predetermined pattern to radiation having a wavelength at which the initiator not activated in stage (ii) is activated, such that in exposed areas the solidified layer is substantially cured, and (iv) removing areas of the solidified layer that have not been substantially cured.

The expression "subjecting . . . in a predetermined pattern to radiation" includes both exposure through an image-bearing transparency consisting of opaque and transparent parts, and also subjection to a beam of radiation moved in a predetermined pattern, for example as directed by a computer, so as to form an image.

The present invention also provides a liquid composition suitable for use in the process of the invention which comprises (A) a polymerizable material having, on average, more than one polymerizable acrylic group per molecule, (B) a first radiation-activated polymerization initiator for (A) and (C) a second radiation-activated polymerization initiator for (A), the initiator (B) being activatable by radiation of longer wavelength than the radiation by which (C) is activatable and the composition being substantially free from polymerizable epoxide or vinyl ether groups when (B) or (C) is an aromatic onium salt.

Preferably, substantially all radiation-polymerizable groups in the composition, i.e. groups polymerizable under the conditions used, are ethylenically unsaturated groups, particularly acrylic groups. Apart from the proviso mentioned hereinbefore, the composition is preferably substantially free from polymerizable epoxide groups.

The polymerizable material (A) may be a material having, on average, more than one group of formula

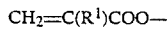
$$CH_2=C(R^1)COO— \qquad I$$

per molecule, where $R^1$ denotes a hydrogen, chlorine, or bromine atom, or an alkyl group of 1 to 4 carbon atoms.

Such materials are well known, including esters of a carboxylic acid containing a group of formula I with polyhydric alcohols, which can be low molecular weight alcohols or film-forming resins such as hydroxyl-terminated polyethers or polyesters or polyvinyl alcohols; esters of a carboxylic acid of formula I with epoxide resins; and acrylic urethane reaction products of isocyanate-terminated polyurethane prepolymers with a hydroxyalkyl ester of a carboxylic acid having a group of formula I.

Preferred polymerizable materials (A) are esters of a carboxylic acid having a group of formula I with a polyhydric alcohol or with an epoxide resin. The carboxylic acid containing a group of formula I may be acrylic acid, methacrylic acid or an adduct formed by reacting a hydroxyalkyl acrylate or hydroxyalkyl methacrylate with a polycarboxylic acid anhydride. Preferred adducts are those derived from 2-hydroxyethyl, 2-hydroxypropyl or 3-hydroxypropyl acrylate or methacrylate and saturated or unsaturated aliphatic anhydrides such as succinic, adipic, glutaric or maleic anhydride, cycloaliphatic anhydrides such as tetrahydrophthalic or hexahydrophthalic anhydride, or aromatic anhydrides such as phthalic, trimellitic or pyromellitic anhydride. Preferred esters are those of acrylic and methacrylic acids, i.e. polyacrylate and polymethacrylate esters of polyhydric alcohols and epoxide resins.

Polyhydric alcohols from which the esters may be derived include those having from 2 to 10 alcoholic hydroxyl groups. Such alcohols may be aliphatic, cycloaliphatic, heterocyclic or aromatic compounds.

Where the polyhydric alcohol is aliphatic, it may have from 2 to 6 hydroxyl groups. Suitable alcohols include diols such as alkylene glycols, for example ethylene, 1,2-propylene, trimethylene, tetramethylene, neopentylene, hexamethylene, octamethylene and dodecamethylene glycols, oxyalkylene glycols such as di(ethylene glycol) and di(propylene glycol) and adducts of the above alkylene glycols with one mol of ethylene oxide or propylene oxide, and polyoxyalkylene glycols such as polyoxyethylene glycols, for example di-, tri- and tetra-ethylene glycols, and higher polyoxyethylene glycols, polyoxypropylene glycols, for example polyoxypropylene glycols such as tri-propylene glycol, and adducts of the alkylene glycols mentioned above with more than one mol of ethylene oxide or propylene oxide. Suitable aliphatic triols include glycerol, 1,1,1-trimethylolpropane and their adducts with ethylene oxide or propylene oxide. Where the aliphatic alcohol from which the ester is derived is a tetrol, it may be erythritol, pentaerythritol, or their adducts with ethylene oxide or propylene oxide. Where the aliphatic polyhydric alcohol is pentol, it may be arabitol, xylitol or their adducts with ethylene oxide or propylene oxide. Suitable aliphatic hexols include dipentaerythritol, mannitol, sorbitol, and their adducts with ethylene oxide or propylene oxide.

Cycloaliphatic polyhydric alcohols from which the esters may be derived are usually cycloaliphatic compounds having from 2 to 6 hydroxyalkyl substituents, for instance $C_5$ to $C_8$ mononuclear cycloaliphatic compounds having two or three hydroxyalkyl substituents, preferably a di- or tri- hydroxymethyl- or hydroxyethyl-substituted cyclohexane.

Where the polyhydric alcohol from which the ester is derived is a heterocyclic alcohol, it may be a heterocyclic compound having from 2 to 6 hydroxyalkyl substituents, for instance a 5- or 6- membered heterocycle having 2 or 3 hydroxyalkyl substituents, preferably a di- or tri-hydroxymethyl- or hydroxyethyl-substituted 5- or 6-membered heterocycle such as isocyanuric acid, uracil, urazole, or uric acid, especially tris(2-hydroxyethyl) isocyanurate.

Aromatic polyhydric alcohols from which the esters can be derived are usually aromatic compounds having from 2 to 8 hydroxyalkyl substituents, including mononuclear compounds such as di- and tri- methylolphenol, and polynuclear compounds such as phenol-formaldehyde resole resins, and adducts of these mononuclear and polynuclear compounds or polyhydric phenols with ethylene oxide or propylene oxide. Preferred aromatic alcohols are 1,3-dimethylolbenzene, 1,3,5-trimethylolbenzene and, particularly, 2,2-bis(p-(2-hydroxyethoxy)phenyl)propane.

The esters of polyhydric alcohols are mostly known compounds or may be made by well-known processes. They may be prepared by reacting the carboxylic acid having a group of formula I, preferably acrylic or methacrylic acid or, more usually, an esterifying derivative thereof, such as acryloyl or methacryloyl chloride, with the polyhydric alcohol. Where the latter contains more than two hydroxyl groups, two hydroxyl groups may be esterified and one or more of the remaining hydroxyl groups left unesterified.

Epoxide resins from which the esters may be derived include those having at least two glycidyl groups attached to an atom or atoms of oxygen, nitrogen or sulphur, and cycloaliphatic epoxide resins in which the epoxide group is part of the ring system. The polyglycidyl compounds may be polyglycidyl esters of aliphatic, cycloaliphatic or aromatic polycarboxylic acids such as adipic, succinic, hexahydrophthalic and phthalic acids, and poly(N-glycidyl) derivatives of aromatic amines such as aniline and bis(4-aminophenyl)methane and hydantoins such as 5,5-dimethylhydantoin. Preferred epoxide resins are polyglycidyl ethers, which may have been advanced, of polyhydric alcohols or phenols, including polyglycidyl ethers of the polyhydric alcohols mentioned above and mononuclear and polynuclear polyhydric phenols. Preferred polyglycidyl ethers are diglycidyl ethers, which may have been advanced, of dihydric alcohols and phenols, including those of the dihydric alcohols mentioned above, those of mononuclear phenols such as resorcinol, bisphenols such as bis(4-hydroxyphenyl)methane and 2,2-bis(4-hydroxyphenyl)propane and polyglycidyl ethers of phenol-aldehyde novolaks. Especially preferred polyglycidyl ethers are diglycidyl ethers, which may have been advanced, of dihydric alcohols having from 2 to 60 carbon atoms, or of bis(4-hydroxyphenyl)methane, 2,2-bis(4-hydroxyphenyl)propane or 2,2-bis(3,5-dibromo-4-hydroxyphenyl)propane, or polyglycidyl ethers of novolaks derived from phenol and formaldehyde. The esters of epoxide resins may be prepared by conventional procedures, for example by reacting the carboxylic acid having a group of formula I, preferably acrylic or methacrylic acid, with the epoxide resin in the presence of a catalyst such as a tertiary amine, an onium salt or a chromium salt of a carboxylic acid.

Mixtures of two or more of the esters having a group of formula I can be used as the polymerizable material (A).

It will be appreciated that some of the materials or mixtures of materials suggested for use as (A) in the liquid composition may be solids or liquids of high viscosity. In order to achieve a liquid composition of the desired viscosity, another radiation-polymerizable liquid vinyl compound may be included in the composition as a reactive diluent. Suitable reactive diluents include monovinyl compounds such as styrene and, particularly, monoacrylates and monomethacrylates such as methyl acrylate, ethyl acrylate, 2-hydroxyethyl acrylate, 2-hydroxypropyl acrylate, 2-ethylhexyl acrylate, 2-(dimethylamino)ethyl acrylate, the corresponding methacrylates and mixtures of two or more thereof.

When it is desired to produce an image which can be developed in aqueous alkali, at least part of the polymerizable material (A) can contain acidic groups, usually carboxyl groups. For example, at least part of (A) may be a carboxyl group-containing resin obtained by reacting epoxide resin-derived esters of acrylic or methacrylic acid, through the secondary hydroxyl groups thereof, with a polycarboxylic acid anhydride such as those hereinbefore specified. Alternatively, the liquid composition may contain another radiation-polymerizable vinyl compound, particularly a monovinyl compound, having an acidic group such as a carboxyl or sulphonic acid group, for example acrylic acid, methacrylic acid, vinylsulphonic acid or a carboxyl-containing adduct of a hydroxyalkyl acrylate or methacrylate with a polycarboxylic acid anhydride as hereinbefore described.

The polymerization initiator (B) must absorb radiation at a longer wavelength than the initiator (C). Suitable initiators (B) include metallocenes; quinones, which can be used alone, where the polymerizable material contains sufficient abstractable hydrogen content, or together with a hydrogen donor such as an amine having hydrogen attached to an aliphatic alpha carbon atom; mixtures of aromatic iodonium salts with dye sensitizers; 3-ketocoumarins, optionally together with a hydrogen donor as hereinbefore described for use with a quinone; acyl phosphine oxides; mixtures of group IVA organometallic compounds, usually stannanes such as trimethyl benzyl stannane, tributyl benzyl stannane, tributyl 4-methylbenzyl stannane or dibutyl dibenzyl stannane, with a photoreducible dye such as methylene blue or rose bengal; and mixtures of two or more thereof.

Preferred initiators (B) are titanium metallocenes; an anthraquinone, a camphorquinone, or a benzoyl coumarin, either alone or in admixture with a tertiary amine having a hydrogen atom attached to an aliphatic alpha carbon atom, such as bis(4-dimethylamino)benzophenone, 4-(N,N-dimethylamino)benzaldehyde or triethanolamine; mixtures of diaryliodonium salts with dye sensitizers; phosphine oxides substituted on the phosphorus atom by at least one acyl group and at least one monovalent aromatic, preferably phenyl, group; or mixtures of two or more thereof. Especially preferred initiators (B) are bis(cyclopentadienyl)bis(fluorosubstituted phenyl) titanium IV compounds such as those described in U.S. Pat. No. 4,590,287, particularly bis(pimethylcyclopentadienyl)bis(sigma-pentafluorophenyl)-titanium IV, bis(pimethylcyclopentadienyl) bis(sigma-decyloxytetrafluorophenyl)titanium IV and bis(pimethylcyclopentadienyl) bis(sigma-hexyloxytetrafluorophenyl)titanium IV; camphorquinone; a mixture of a benzoyl coumarin, such as 3-benzoyl-7-methoxy coumarin or 3-(4-cyanobenzoyl)-5,7-dipropoxy coumarin, with a dialkylamino-substituted aromatic aldehyde or ketone; a mixture of a diphenyliodonium salt, such as a diphenyliodonium, bis(chlorophenyl)iodonium, bis(nitrophenyl)iodonium or bis(methoxyphenyl)iodonium salt of, for example, hydrochloric, sulphuric, hexafluorophosphoric or hexafluoroarsenic acids, with a dye sensitizer, usually a cationic dye such as Acridine orange, Acridine yellow, Phosphine R, Benzoflavin or Setoflavin or a basic dye such as hematoporphyrin, 4,4'-bis(dimethylamino)benzophenone or 4,4'-bis(diethylamino)benzophenone; or an acyldiphenylphosphine oxide such as pivaloyldiphenylphosphine oxide or 4-anisoyldiphenylphosphine oxide.

Suitable initiators (C) include free-radical generating aromatic carbonyl compounds which absorb radiation at a shorter wavelength than the initiator used as (B). Such carbonyl compounds are well known. They can be compounds which on irradiation produce free radicals either by photolytic dissociation or by a reaction, usually hydrogen transfer, with another molecule. Thus suitable initiators (C) include alpha-substituted acetophenones, benzils, benzoin ethers such as benzoin isopropyl ether, benzophenones, xanthones, thioxanthones, and mixtures of two or more thereof, with alpha-substituted acetophenones, thioxanthones and mixtures thereof being preferred. As is well understood, thioxanthones can be used together with a hydrogen donor, for example a tertiary amine-substituted aromatic ester or ketone such as ethyl-p-dimethylaminobenzoate, or when the polymerizable material contains sufficient abstractable hydrogen, can be used alone. Suitable alpha-substituted acetophenones are those in which at least one of the hydrogen atoms on the alpha carbon atom is replaced by another atom or group, such as halogen atoms, hydroxyl groups, unsubstituted amino groups, etherified or esterified hydroxyl groups, substituted amino groups, alkyl groups, which can be substituted or unsubstituted, and other organic groups. Such alpha-substituted acetophenones are described in U.S. Pat. Nos. 4,190,602, 4,308,400, 4,318,791, 4,559,371 and 4,582,862 and in EP-A-0 108 037.

Examples of suitable alpha-substituted acetophenones are benzil ketals, including alpha-alkoxyacetophenones and particularly alpha-dialkoxyacetophenones; alpha-haloacetophenones such as trichloromethyl p-tert.butylphenyl ketone; alpha-hydroxyacetophenones such as 1-hydroxycycloalkyl phenyl ketones (1-benzoylcycloalkanols); and alpha-aminoacetophenones, in which the amino group may be substituted or unsubstituted.

Preferred initiators (C) are benzil ketals, alpha-hydroxyacetophenones, alpha-aminoacetophenones, alkyl- or halo-substituted thioxanthones, and mixtures of two or more thereof. Especially preferred initiators (C) are benzil dialkyl ketals such as diethoxyacetophenone and, particularly, benzil dimethyl ketal; 1-hydroxycycloalkyl phenyl ketones such as 1-hydroxycyclopentyl phenyl ketone (1-benzoylcyclopentanol) and, particularly, 1-hydroxycyclohexyl phenyl ketone (1-benzoylcyclohexanol); acetophenones substituted on the alpha carbon atom by a tertiary amino group, such as dimethylaminomethyl phenyl ketone, morpholinomethyl phenyl ketone and, particularly, alpha, alpha-dimethyl-alpha-N-morpholino-p-(methylthio)acetophenone (i.e. 2-methyl-1-[p-(methylthio)phenyl]-2-morpholinopropanone); and alkyl-substituted thioxanthones such as 2-tert.butylthioxanthone and, particularly, 2-isopropylthioxanthone, preferably in admixture with a tertiary amino-substituted aromatic ester or ketone, particularly ethyl-p-dimethylaminobenzoate.

It will be appreciated by those skilled in the art of image formation using photopolymerization that some of the initiators specified as suitable for use as (B) can be used as (C) when an appropriate initiator (B) and an appropriate wavelength for irradiation in stage (ii) are chosen. For example, an acyl phosphine oxide can be used as (C) when a titanium metallocene is used as (B). Similarly, some of the initiators specified as suitable for use as (C) can be used as (B) when an appropriate initiator (C) and an appropriate wavelength for irradiation in stage (ii) are chosen. For example, a thioxanthone can be used as (B) when an alpha-hydroxyacetophenone such as 1-benzoylcyclohexanol is used as (C).

The blanket irradiation to effect solidification in stage (ii) of the process of the invention may be carried out using radiation having a wavelength at which (B) is activated but not (C), or using radiation having a wavelength at which (C) but not (B) is activated. Thus stage (ii) can be carried out using radiation of longer or shorter wavelength than that used in the imagewise irradiation stage (iii). Preferably, stage (ii) is effected using radiation having a wavelength at which (B) but not (C) is activated, i.e. at a longer wavelength than the imagewise irradiation stage (iii). In this preferred embodiment, stage (ii) is preferably effected using electromagnetic radiation having a wavelength of at least 400 nm, especially at least 450 nm, and stage (iii) is effected using electromagnetic radiation having a wavelength in the range 200–450 nm, but shorter than the wavelength used in stage (ii). When (B) is activated in stage (ii) and (C) in stage (iii), it will be understood that there is no need to prevent radiation of longer wavelength from reaching the solidified layer in stage (iii). In stage (iii), therefore, the shorter wavelength radiation can be used together with radiation of longer wavelength. Thus a radiation source emitting radiation having a broad range of wavelengths can be used in stage (iii), provided it has a substantial emission of radiation having a wavelength required to activate (C).

The amounts of (B) and (C) used in the liquid composition depend on which of them is to be activated in the blanket irradiation stage (ii). In general, the initiator which is to be activated in stage (ii) is used in an effective amount of up to 5 parts per 100 parts by weight of radiation-polymerizable material, including polymerizable reactive diluents, in the composition. Although it might be possible to use inefficient initiators to be activated in stage (ii) in greater amounts, the use of more than this 5% level generally increases the risk that polymerization in stage (ii) will proceed too far so that the imagewise irradiation in stage (iii) will not result in formation of an image. The amount of the initiator to be activated in stage (iii) is less significant, effective amounts up to 30 parts per 100 parts by weight of radiation-polymerizable material generally being usable. Thus in preferred embodiments of the process of the invention, when (B) is activated in stage (ii), the liquid composition contains generally, per 100 parts by weight of radiation-polymerizable material, that is (A) together with any polymerizable reactive diluent, up to 5 parts, preferably 0.1 to 4 parts, by weight of (B) and up to 30 parts, preferably 1 to 10 parts, and especially 2 to 5 parts, by weight of (C).

The liquid composition may also contain further additives known and conventionally employed in the technology of image formation. Examples of such additives are pigments, dyes, fillers and reinforcing agents, flame retardants, antistatic agents, levelling agents, antioxidants, light stabilisers, surfactants and film-forming binder polymers such as polyvinyl alcohols and cellulose acetate butyrate. Small amounts of non-reactive diluents such as propylene carbonate may be added to aid solution formation.

Suitable sources of actinic radiation include carbon arcs, mercury vapour arcs, fluorescent lamps with phosphors emitting ultraviolet light, argon and xenon glow lamps, tungsten lamps, and photographic flood lamps. It is important that the first irradiation is effected using radiation of a different wavelength from that used in the second irradiation. The use of filters, to screen out irradiation of unwanted wavelengths, may be found to be advantageous since, in this way, a single, wide spectrum source of irradiation may be used. If such a single source of radiation is used, the first exposure is effected with a filter preventing radiation of a wavelength which will activate the initiator to be activated in stage (iii) from reaching the composition. In the second exposure, the whole unfiltered spectrum of radiation may be used, so that radiation which effects activation of the initiator for stage (iii) can reach the composition.

As is well understood by those skilled in the art of photoimaging, these radiation sources emit small amounts of radiation over a range of wavelengths, but emit most of their radiation at a particular wavelength - the wavelength intensity maximum. When reference is made in this specification to the use of radiations having different wavelengths, it will be understood that it is the wavelength intensity maxima of the radiation used in stages (ii) and (iii) which must be different. Overlap of the spectral regions at which the radiation used in stages (ii) and (iii) emit small amounts of radiation will generally not inhibit successful operation of the process of the invention.

The compositions as described may be applied as a liquid to a substrate such as steel, aluminium, copper, paper, silicon or plastics. After the coating has been applied, the first, blanket, exposure takes place to solidify the composition. This exposure need only be long enough to activate the initiator for this stage; usually a few minutes is sufficient, the actual time needed being readily determinable by simple experiment. The coated substrate is then stable and may be stored for prolonged periods away from radiation which will activate the initiator for stage (iii). When desired, the coated substate is given an imagewise exposure to actinic radiation of a different wavelength from that used in the first exposure, the exposure time needed for image formation being determinable by a simple experiment. Those parts of the coating which have not received the second exposure may then be removed, usually by treatment with a solvent such as cyclohexanone, 2-ethoxyethanol, diethylene glycol monobutyl ether, gamma butyrolactone, toluene, acetone, propylene carbonate, 1,1,1-trichloroethane and mixtures thereof, and aqueous solvents such as dilute aqueous sodium carbonate or sodium hydroxide. Dry development, such as plasma etching, may also be used. The parts of the coating which have received the second exposure are left on the substrate, forming a negative image. Thus the process of the invention may be used in the production of printing plates and printed circuits, using well known techniques.

The invention is illustrated by the following Examples, in which parts and percentages are by weight unless specified otherwise.

Polymerisable materials, having, on average, more than one acrylic group per molecule used in the Examples are as follows:

RESIN I

This is prepared by the following method:
bisphenol A diglycidyl ether (250 g) is heated to 120° C. and a mixture of acrylic acid (94.9 g), chromium III tris octanoate (0.16 g; 5% solution in ligroin), and 2,6-di-tert.butyl-4-methyl phenol (0.5 g) is added dropwise with stirring. Heating is continued for 5 hours, by which time the epoxide content of the mixture is negligible. The product, Resin I, is 2,2-bis(4-(3-acryloyloxy-2-hydroxypropoxy)phenyl)propane.

RESIN II

This is prepared by the following method:

A mixture of a 2,2-bis(4-hydroxyphenyl)propane based epoxy resin having an epoxide content of 1.6 equivalents/kg (100 g) and 2,6-di-tert.-butyl-4-methylphenol (0.1 g) is heated until molten, stirred and heated to 130° C. A mixture of acrylic acid (10.7 g), chromium III trisoctanoate (0.1 g); 5% solution in ligroin) and 2,6-di-tert.butyl-4-methylphenol (0.2 g) is added dropwise over 30 minutes while stirring. Heating is continued for 2 hours, by which time the epoxide content of the mixture is negligible. This gives Resin II.

RESIN III

This denotes tris(2-acryloyloxyethyl)isocyanurate.

RESIN IV

This denotes 1,1,1-trimethylolpropane trisacrylate.

RESIN V

This denotes tetramethylene glycol dimethacrylate.

RESIN VI

This denotes 2,2-bis(p-(2-methacryloyloxyethoxy)-phenyl)propane.

The radiation sources used in the Examples are the following lamps:
(1) a 500 w tungsten lamp: this emits radiation above 450 nm, radiation of shorter wavelength being cut out by a filter.
(2) 5 kw metal halide lamp: this emits radiation of wavelength 340–450 nm, having a wavelength intensity maximum at 435 nm.
(3) 5000 w lamp: this emits radiation of wavelength 350–450 nm, with a wavelength intensity maximum at 420 nm.
(4) 120 w/cm electrodeless lamp: this emits radiation of wavelength 350–450 nm, having a wavelength intensity maximum at 420 nm.

EXAMPLE 1

Resin I (6 parts), 2-hydroxyethyl methacrylate (4 parts), bis(pi-methylcyclopentadienyl)bis(sigma-hexyloxytetrafluorophenyl) titanium IV (0.05 part), benzildimethyl ketal (0.25 part) and propylene carbonate (0.1 part) are mixed until a solution is obtained.

The mixture is coated onto a copper-clad laminate to a thickness of 24 micrometers. The coating is irradiated under nitrogen using a 500 w tungsten halogen lamp, fitted with a filter to cut out radiation below 450 nm, at a distance of 20 cm for 30 seconds. The solidified coating is then irradiated through a transparency using a 5 kW metal halide lamp at a distance of 75 cm for 1 minute. Development in toluene gives a negative image of the transparency.

EXAMPLE 2

Resin I (5 parts), acrylic acid (5 parts), DL-camphoroquinone (0.25 part) and 1-benzoylcyclohexanol (0.25 part) are mixed until a solution is obtained.

The mixture is coated onto a copper-clad laminate to a thickness of 24 micrometers. The coating is irradiated under nitrogen using a 500 w tungsten halogen lamp as described in Example 1 at a distance of 20 cm for 5 minutes. The solidified coating is then irradiated through a transparency using a 5 kW metal halide lamp at a distance of 75 cm for 1 minute. Development in 2% aqueous sodium hydroxide gives a negative image of the transparency.

EXAMPLE 3

Resin II (5 parts), methyl methacrylate (5 parts), bis(pi-methylcyclopentadienyl)bis(sigma-pentafluorophenyl))titanium IV (0.1 part), 2-methyl-1-[4-(methylthio)phenyl]-2-morpholinopropanone (0.25 part) and propylene carbonate (0.1 part) are mixed until a solution is obtained.

The mixture is coated onto a copper-clad laminate to a thickness of 24 micrometers. The coating is irradiated under nitrogen using a 500 w tungsten halogen lamp as described in Example 1 at a distance of 20 cm for 60 seconds. The solidified coating is then irradiated through a transparency using a 5 kW metal halide lamp at a distance of 75 cm for 1 minute. Development in toluene gives a negative image of the transparency.

EXAMPLE 4

Resin III (7.5 parts), 2-ethylhexyl acrylate (2.5 parts), diphenyliodonium hexafluorophosphate (0.25 part), acridine orange (0.05 part), benzil dimethyl ketal (0.25 part) and propylene carbonate (0.1 part) are mixed until a solution is obtained.

The mixture is coated onto a copper-clad laminate to a thickness of 24 micrometers. The coating is then irradiated under nitrogen using a 500 w tungsten halogen lamp as described in Example 1 at a distance of 20 cm for 2 minutes. The solidified coating is then irradiated through a transparency using a 5 kW metal halide lamp at a distance of 75 cm for 1 minute. Development in toluene gives a negative image of the transparency.

EXAMPLE 5

Resin IV (4 parts), 2-(dimethylamino)ethyl methacrylate (6 parts), bis(pi-methylcyclopentadienyl)bis(sigma-hexyloxytetrafluorophenyl) titanium IV (0.05 part), 2-isopropylthioxanthone (0.25 part) and ethyl p-(dimethylamino)benzoate (0.15 part) are mixed until a solution is obtained.

The mixture is coated onto a copper-clad laminate to a thickness of 12 micrometers. The coating is irradiated under nitrogen using a 500 w tungsten halogen lamp as described in Example 1 at a distance of 20 cm for 3 minutes. The solidified coating is then irradiated through a transparency using a 5 kW metal halide lamp at a distance of 75 cm for 1 minute. Development in toluene gives a negative image of the transparency.

EXAMPLE 6

Resin I (6 parts), 2-hydroxyethyl methacrylate (4 parts), bis(pi-methylcyclpentadienyl)bis(sigma-hexyloxytetrafluorophenyl) titanium IV (0.05 part), benzil dimethyl ketal (0.25 part) and propylene carbonate (0.1 part) are mixed until a solution is obtained.

The mixture is coated onto a copper-clad laminate to a thickness of 24 micrometers. The coating is irradiated under nitrogen using the 500 w tungsten lamp as described in Example 1 at a distance of 20 cm for 30 seconds. The solidified coating is then irradiated through a transparency using a 5 kW metal halide lamp at a distance of 75 cm for 5 seconds. Development in toluene gives a negative image of the transparency.

EXAMPLE 7

Resin VI (10 parts), bis(pi-methylcyclopentadienyl)-bis(sigmadecyloxytetrafluorophenyl) titanium IV (0.05 part), benzil dimethyl ketal (0.25 part) and propylene carbonate (0.1 part) are mixed until a solution is obtained.

The mixture is coated onto a copper-clad laminate to a thickness of 24 micrometers. The coating is irradiated under nitrogen using a 500 w tungsten halogen lamp fitted with a filter to cut out radiation below 450 nm, at a distance of 20 cm, for 90 seconds. The resulting solidified coating is then irradiated through a transparency using a 5 kW metal halide lamp at a distance of 75 cm for 1 minute. Development in toluene gives a negative image of the transparency.

EXAMPLE 8

Resin I (5 parts), Resin VI (5 parts), bis(pi-methylcyclopentadienyl)-bis(sigma-decyloxytetrafluorophenyl)-titanium IV (0.05 part), benzil dimethyl ketal (0.25 part) and propylene carbonate (0.1 part) are mixed until a solution is obtained.

The mixture is coated onto a copper-clad laminate to a thickness of 24 micrometers. The coating is irradiated under nitrogen using a 500 w tungsten-halogen lamp, fitted with a filter to cut out radiation below 450 nm, at a distance of 20 cm for 120 seconds. The resulting solidified coating is then irradiated through a transparency, using a 5 kW metal halide lamp at a distance of 75 cm for 1 minute. Development in toluene gives a negative image of the transparency.

EXAMPLE 9

Resin I (6 parts), 2-hydroxyethyl methacrylate (4 parts), bis(pi-methylcyclopentadienyl) bis(sigma-decyloxytetrafluorophenyl)titanium IV (0.05 part) and pivaloyldiphenylphosphine oxide (0.15 part) are mixed until a solution is obtained.

The mixture is coated onto a copper-clad laminate to a thickness of 24 micrometers. The coating is irradiated under nitrogen using a 500 w tungsten-halogen lamp, fitted with a filter to cut out radiation below 450 nm, at a distance of 20 cm for 150 seconds. The resulting solidified coating is then irradiated through a transparency using a 5 kW metal halide lamp at a distance of 75 cm for 1 minute. Development in acetone gives a negative image of the transparency.

EXAMPLE 10

Resin I (6 parts), Resin V (4 parts), bis(pi-methylcyclopentadienyl)bis(sigma-decyloxytetrafluorophenyl)-titanium IV (0.04 part), benzil dimethyl ketal (0.25 part) and propylene carbonate (0.1 part) are mixed until a solution is obtained.

The mixture is coated onto a copper-clad laminate to a thickness of 24 micrometers. The coating is irradiated under nitrogen using a 500 w tungsten halogen lamp, fitted with a filter to cut out radiation below 450 nm, at a distance of 20 cm for 150 seconds. The resulting solidified coating is then irradiated through a transparency using a 5 kW metal halide lamp at a distance of 75 cm for 1 minute. Development in toluene gives a negative image of the transparency.

EXAMPLE 11

Resin I (5 parts), Resin VI (5 parts), bis(pi-methylcyclopentadienyl)bis(sigma-decyloxytetrafluorophenyl)-titanium IV (0.05 part) and benzil dimethyl ketal (0.25 part) are mixed until a solution is obtained.

The mixture is coated onto a copper-clad laminate to a thickness of 24 micrometers. The coating is irradiated using a 120 w/cm electrodeless lamp, fitted with a filter to cut out radiation below 420 nm, at 2.8 m per minute for 10 passes.

The resulting solidified coating is irradiated through a transparency using a 5 kW metal halide lamp at a distance of 75 cm for 1 minute. Development in toluene gives a negative image of the transparency.

EXAMPLE 12

Resin I (5 parts), acrylic acid (5 parts), 3-benzoyl-7-methoxy coumarin (0.1 part), 4-(N,N-dimethylamino)-benzaldehyde (0.5 part) and benzil dimethyl ketal (0.2 part) are mixed until a solution is obtained.

The mixture is coated onto a copper-clad laminate to a thickness of 24 micrometers. The coating is irradiated using a 5000 w lamp (lamp 3), fitted with a filter to cut out radiation below 400 nm, at a distance of 75 cm for 5 minutes. The resulting solidified coating is then irradiated through a transparency using a 5 kW metal halide lamp at a distance of 75 cm for 1 minute. Development in 1M aqueous sodium hydroxide solution gives a negative image of the transparency.

EXAMPLE 13

Resin I (6 parts), 2-hydroxyethylmethacrylate (4 parts), 4-anisoyl diphenylphosphine oxide (0.2 part) and benzil dimethyl ketal (0.2 part) are mixed until a solution is obtained.

The mixture is coated onto a copper-clad laminate to a thickness of 24 micrometers. The coating is irradiated using a 5000 w lamp (lamp 3), fitted with a filter to cut out radiation below 400 nm, at a distance of 75 cm for 10 minutes.

The resulting solidified coating is then irradiated through a transparency using a 5 kW metal halide lamp at a distance of 75 cm for 1 minute. Development in acetone gives a negative image of the transparency.

What is claimed is:

1. A process for the formation of an image which comprises
   (i) applying to a substrate a layer of a liquid composition which comprises
      (A) a polymerizable material having, on average, more than one polymerizable acrylic group per molecule,
      (B) a first radiation-activated polymerization initiator for (A) and
      (C) a second radiation-activated polymerization initiator for (A), the initiator (B) being activatable by radiation of longer wavelength than that of radiation by which (C) is activatable,
   with the proviso that when (B) or (C) is an aromatic onium salt, the composition is substantially free from polymerizable epoxide or vinyl ether groups,
   (ii) subjecting the composition to radiation having a wavelength at which one of (B) and (C) is activated but the other is not substantially activated, thereby polymerizing (A) such that the layer of liquid composition is solidified but remains curable,
   (iii) subjecting the solidified layer in a predetermined pattern to radiation having a wavelength at which the initiator not activated in stage (ii) is activated, such that in exposed areas the solidified layer is substantially cured, and
   (iv) removing areas of the solidified layer that have not been substantially cured.

2. A process according to claim 1, in which the composition is substantially free from polymerizable epoxide groups.

3. A process according to claim 1, in which (A) is a polyacrylate or polymethacrylate ester of a polyhydric alcohol or of an epoxide resin.

4. A process according to claim 1, in which the liquid composition also contains a radiation-polymerizable liquid monovinyl compound as a reactive diluent.

5. A process according to claim 4, in which the monovinyl compound is a monoacrylate or monomethacrylate.

6. A process according to claim 1, in which the initiator (B) is a metallocene; a quinone; a mixture of an aromatic iodonium salt with a dye sensitizer; a 3-ketocoumarin; an acyl phosphine oxide; a mixture of a group IVA organometallic compound with a photoreducible dye; or a mixture of two or more thereof; and the initiator (C) is an alpha-substituted acetophenone, a thioxanthone, or a mixture thereof.

7. A process according to claim 6, in which (B) is a titanium metallocene; an anthraquinone, a camphorquinone or a benzoyl coumarin, or said quinone or said coumarin in admixture with a tertiary amine having a hydrogen atom attached to an aliphatic alpha carbon atom; a mixture of a diaryliodonium salt with a dye sensitizer; a phosphine oxide substituted on the phosphorus atom by at least one acyl group and at least one monovalent aromatic group; or a mixture of two or more thereof; and (C) is a benzil ketal, an alpha-hydroxyacetophenone, an alpha-aminoacetophenone, an alkyl- or halo-substituted thioxanthone or a mixture of two or more thereof.

8. A process according to claim 7, in which (B) is a bis(cyclopentadienyl) bis(fluoro-substituted phenyl) titanium IV; camphorquinone; a mixture of a benzoyl coumarin with a dialkylamino-substituted aromatic aldehyde or ketone; a mixture of a diphenyl iodonium salt with a dye sensitizer; or an acyldiphenylphosphine oxide; and (C) is a benzil dialkyl ketal, a 1-hydroxycycloalkyl phenyl ketone, an acetophenone substituted on the alpha carbon atom by a tertiary amino group or an alkyl-substituted thioxanthone.

9. A process according to claim 1, in which stage (ii) is effected using radiation having a wavelength at which (B) but not (C) is activated.

10. A process according to claim 9, in which stage (ii) is effected using electromagnetic radiation having a wavelength of at least 400 nm and stage (iii) is effected using radiation having a shorter wavelength than radiation used in stage (ii).

11. A process according to claim 1, in which stage (iv) is carried out by treatment with a solvent.

12. An image formed by a process according to claim 1.

* * * * *